(12) United States Patent
Shan et al.

(10) Patent No.: US 11,603,983 B2
(45) Date of Patent: Mar. 14, 2023

(54) LED LIGHT STRING ORNAMENT AND METHOD FOR MANUFACTURING THE SAME

(71) Applicant: Zhuhai Bojay Electronics Co. Ltd., Guangdong (CN)

(72) Inventors: Xiwan Shan, Guangdong (CN); Tuxiu Yang, Guangdong (CN); Yundong Ai, Guangdong (CN); Jie Zhang, Guangdong (CN); Qunlin Li, Guangdong (CN); Qiming Liu, Guangdong (CN); Su Yan, Guangdong (CN); Jingtian Wu, Guangdong (CN)

(73) Assignee: Zhuhai Bojay Electronics Co. Ltd.

( * ) Notice: Subject to any disclaimer, the term of this patent is extended or adjusted under 35 U.S.C. 154(b) by 227 days.

(21) Appl. No.: 17/002,105

(22) Filed: Aug. 25, 2020

(65) Prior Publication Data
US 2021/0071850 A1 Mar. 11, 2021

(30) Foreign Application Priority Data

Sep. 6, 2019 (CN) .......................... 201910842589.2
Jul. 6, 2020 (CN) .......................... 202010638677.3

(51) Int. Cl.
*F21S 4/00* (2016.01)
*F21V 17/16* (2006.01)
(Continued)

(52) U.S. Cl.
CPC ................ *F21V 17/16* (2013.01); *F21S 4/10* (2016.01); *F21V 3/02* (2013.01); *F21V 19/0025* (2013.01);
(Continued)

(58) Field of Classification Search
CPC ........ F21S 4/10; F21S 4/20; F21S 4/26; F21V 17/16; F21V 3/00; F21V 3/02;
(Continued)

(56) References Cited

U.S. PATENT DOCUMENTS 7,901,263 B2  3/2011  Tsai
7,926,978 B2  4/2011  Tsai
(Continued)

FOREIGN PATENT DOCUMENTS

CN  201688230 U  12/2010
CN  203560768 U  4/2014
(Continued)

OTHER PUBLICATIONS

U.S. Appl. No. 16/888,282 Non-Final Office Action, dated Mar. 8, 2021, 95 pages.
(Continued)

*Primary Examiner* — Y M. Quach Lee
(74) *Attorney, Agent, or Firm* — Adsero IP

(57) ABSTRACT

The present disclosure discloses an LED light string ornament and a method for producing the same. The LED light string ornament includes an LED light string and a plurality of decorative pieces. The LED light string includes three wires, a plurality of SMD LEDs, and a plurality of adhesive bodies. A part or a whole of the decorative piece are transparent or semi-transparent. The decorative piece includes a first housing and a second housing. The first housing and the second housing are buckled to form an accommodating cavity, and a plurality of LED beads of the LED light string are respectively accommodated in the accommodating cavities of the plurality of decorative pieces.

12 Claims, 14 Drawing Sheets

(51) Int. Cl.
*F21S 4/10* (2016.01)
*F21V 3/02* (2006.01)
*F21V 19/00* (2006.01)
*F21V 21/08* (2006.01)
*F21Y 113/10* (2016.01)
*F21Y 115/10* (2016.01)

(52) U.S. Cl.
CPC ........... *F21V 21/08* (2013.01); *F21Y 2113/10* (2016.08); *F21Y 2115/10* (2016.08)

(58) Field of Classification Search
CPC .... F21V 19/002; F21V 19/0025; F21V 21/08; F21V 23/001; F21Y 2113/10; F21Y 2115/10
See application file for complete search history.

(56) References Cited

U.S. PATENT DOCUMENTS

| | | | |
|---|---|---|---|
| 10,281,094 B2 | 5/2019 | Liu | |
| 10,697,598 B1 * | 6/2020 | Chen | F21S 4/20 |
| 10,907,781 B2 | 2/2021 | Shao | |
| 10,920,941 B1 | 2/2021 | Shan et al. | |
| 11,118,743 B2 | 9/2021 | Shan et al. | |
| 11,204,140 B2 | 12/2021 | Shan et al. | |
| 11,293,628 B2 | 4/2022 | Shan et al. | |
| 2002/0089859 A1 | 7/2002 | Jackson et al. | |
| 2005/0207151 A1 | 9/2005 | Aanegola et al. | |
| 2007/0208395 A1 | 9/2007 | Leclerc et al. | |
| 2008/0200089 A1 | 8/2008 | Tsai | |
| 2009/0046461 A1 * | 2/2009 | Fan | F21V 3/02 |
| | | | 362/235 |
| 2011/0310601 A1 | 12/2011 | Shao | |
| 2014/0009074 A1 | 1/2014 | Chen | |
| 2014/0268818 A1 | 9/2014 | Huang et al. | |
| 2015/0077999 A1 | 3/2015 | Chen | |
| 2016/0341408 A1 | 11/2016 | Altamura | |
| 2017/0328527 A1 | 11/2017 | Yang et al. | |
| 2017/0336037 A1 | 11/2017 | Chien | |
| 2018/0119929 A1 | 5/2018 | Weiss | |
| 2018/0209595 A1 | 7/2018 | Liu | |
| 2019/0069649 A1 | 3/2019 | Qin | |
| 2019/0101254 A1 | 4/2019 | Tsai | |
| 2019/0103736 A1 | 4/2019 | Tsai et al. | |
| 2019/0234597 A1 | 8/2019 | Zhu et al. | |
| 2019/0277458 A1 | 9/2019 | Shao | |
| 2019/0368670 A1 | 12/2019 | Gao | |
| 2019/0376669 A1 | 12/2019 | Shao et al. | |
| 2020/0278091 A1 | 9/2020 | Chen et al. | |
| 2021/0071827 A1 | 3/2021 | Shan et al. | |
| 2021/0071828 A1 | 3/2021 | Shan et al. | |
| 2021/0071829 A1 | 3/2021 | Shan et al. | |
| 2021/0071852 A1 | 3/2021 | Shan et al. | |
| 2021/0071854 A1 | 3/2021 | Shan et al. | |

FOREIGN PATENT DOCUMENTS

| | | |
|---|---|---|
| CN | 203571516 U | 4/2014 |
| CN | 203771161 U | 8/2014 |
| CN | 204328616 U | 5/2015 |
| CN | 204477773 U | 7/2015 |
| CN | 205535227 U | 8/2016 |
| CN | 206496230 U | 9/2017 |
| CN | 107559646 A | 1/2018 |
| CN | 207539677 U | 6/2018 |
| CN | 110617414 A | 12/2019 |
| GB | 2586903 A | 6/2020 |
| KR | 10-1629749 B1 | 6/2016 |
| WO | WO-2019-041745 A1 | 3/2019 |

OTHER PUBLICATIONS

Extended European Search Report, Application No. 20194300.8, dated Feb. 9, 2021, 8 pages.
U.S. Appl. No. 16/888,222 Notice of Allowance, dated May 18, 2021, 36 pages.
U.S. Appl. No. 16/888,286 Final Office Action dated Jul. 16, 2021, 28 pages.
U.S. Appl. No. 16/888,296 Office Action Restriction Requirement, dated Jul. 16, 2021, 6 pages.
Canadian Application No. 3080041, Office Action, dated Jun. 29, 2021, 6 pages.
U.S. Appl. No. 16/888,222 Non-Provisional Application, filed on May 29, 2020, 29 pages.
U.S. Appl. No. 16/888,282 Non-Provisional Application, filed on May 29, 2020, 36 pages.
U.S. Appl. No. 16/888,286 Non-Provisional Application, filed on May 29, 2020, 36 pages.
U.S. Appl. No. 16/888,290 Non-Provisional Application, filed on May 29, 2020, 31 pages.
U.S. Appl. No. 16/888,296 Non-Provisional Application, filed on May 29, 2020, 39 pages.
GB Application No. GB2006270.9, Examination Report dated Jun. 12, 2020, 1 page.
GB Application No. GB2006270.9, Search Report dated Jun. 11, 2020, 1 page.
GB Application No. GB2006267.5, Examination Report dated Jun. 12, 2020, 2 pages.
GB Application No. GB2007273.2, Examination Report dated Jun. 15, 2020, 2 pages.
GB Application No. GB2006271.7, Examination Report dated Jun. 12, 2020, 2 pages.
U.S. Appl. No. 16/888,290 Notice of Allowance, dated Nov. 13, 2020, 20 pages.
U.S. Appl. No. 16/888,286 Notice of Allowance, dated Sep. 22, 2021, 30 pages.
U.S. Appl. No. 16/888,296 Non-Final Office Action, dated Sep. 27, 2021, 54 pages.
U.S. Appl. No. 16/888,282 Final Office Action, dated Sep. 30, 2021, 30 pages.
U.S. Appl. No. 16/888,282 Notice of Allowance, dated Dec. 17, 2021, 33 pages.
Canadian Application No. 3,081,297, Office Action, dated Jul. 7, 2021, 4 pages.
U.S. Appl. No. 16/888,222 Non-Final Office Action, dated Dec. 16, 2020 pages.
U.S. Appl. No. 16/888,282 Office Action-Restriction Requirement, dated Dec. 18, 2020, 7 pages.
U.S. Appl. No. 16/888,286 Non-Final Office Action dated Jan. 27, 2021, 27 pages.
Canadian Application No. 3,089,796, Office Action, dated Jun. 25, 2021, 5 pages.
U.S. Office Action dated Nov. 10, 2022; U.S. Appl. No. 17/6/9,990.

* cited by examiner

LED LIGHT STRING ORNAMENT AND METHOD FOR MANUFACTURING THE SAME

CROSS REFERENCE TO RELATED APPLICATIONS

This application claims all benefits accruing under 35 U.S.C. § 119 to Chinese Patent Applications No. 2020106386773 filed on Jul. 6, 2020 and No. 2019108425892 filed on Sep. 6, 2019 in the China National Intellectual Property Administration, the content of which is hereby incorporated by reference.

TECHNICAL FIELD

The present disclosure relates to a field of lighting technology, and more particularly to a Light-Emitting Diode (LED) light string ornament and a method for manufacturing the same.

BACKGROUND

The LED light string is a kind of decorative lighting ornament including a luminous LED bead and a wire, which is widely used in decoration, construction, landscape and other industries. The LED string light is popular because of its characteristic such as energy saving, environmental protection, beautiful appearance, and low price. In order to increase beauty and lifetime of an LED light string product, some LED light strings are provided with an ornament piece in a position of an LED bead. This kind of LED light string ornament is typically manufactured by manufacturing or purchasing the LED light string from the market firstly, and then assembling the ornament piece on to the LED beads manually. In such a way, an assembling efficiency is low, a manufacturing cost is high, and product quality cannot be guaranteed.

SUMMARY

In view of the above-mentioned current state of the prior art, the technical problem to be solved by the present disclosure is to provide an LED light string ornament with high manufacturing efficiency, high product quality and low manufacturing cost. Another objective of the present disclosure is to provide a method for manufacturing the above-mentioned LED light string ornament.

In order to solve the above technical problems, the LED light string ornament according to the present disclosure includes an LED light string and a plurality of decorative pieces. The LED light string includes at least three wires, a plurality of Surface Mounted Device (SMD) LEDs, and a plurality of packaging adhesive bodies. The at least three wires are arranged side by side or twisted together. The plurality of wire includes a wire core and an insulating layer covering a surface of the wire core. At least two of the at least three wires are formed with a plurality of pairs of opposed solder joints by removing the insulating layer thereof in an axial direction thereof at an interval of a set length. Each solder foot of the plurality of SMD LEDs is soldered to each solder joint of the plurality of pairs of the solder joints respectively to connect the plurality of SMD LEDs in parallel, in series or in a hybrid connection. The plurality of packaging adhesive bodies are respectively wrapped on surfaces of the plurality of SMD LEDs to form a plurality of LED beads. A part or a whole of the decorative piece is transparent or semi-transparent. The decorative piece includes a first housing and a second housing. The first housing and the second housing are buckled to form an accommodating cavity. The plurality of LED beads of the LED light string are respectively accommodated in the accommodating cavities of the plurality of decorative pieces.

According to the LED light string ornament provided by the present disclosure, the LED light string and the decorative piece can all be manufactured automatically, which is advantageous for reducing a labor cost, and reducing a labor intensity. The manufacturing efficiency and the product quality of the light string can be improved effectively. Moreover, the decorative piece can increase the beauty of the product and protect the LED bead.

According to the present disclosure, a method for manufacturing an LED light string ornament includes:

arranging two wires side by side on a production line;

conveying the two wires to a wire stripping station, and removing insulating layers of the two wires at a set interval to form a pair of opposed solder joints; conveying the pair of solder joints to a soldering material coating station, and coating surfaces of the pair of solder joints with soldering material;

conveying the pair of solder joints the surfaces of which are coated with soldering material to an LED mounting station, and placing two solder feet of a Surface Mounted Device (SMD) LED on the pair of solder joints;

conveying the SMD LED placed on the pair of solder joints to a soldering station, and soldering the two solder feet of the SMD LED respectively to the pair of solder joints;

conveying the soldered SMD LED to a soldering inspection station to inspect a soldering quality of the SMD LED;

arranging a third wire side by side with the two wires on the production line;

conveying the inspected SMD LED and the third wire to a first packaging station, and packaging the SMD LED and a portion of the third wire corresponding to a position of the SMD LED inside a packaging adhesive body to form an LED bead;

conveying the LED bead to a wire cutting station, and determining whether it is to cut the wire off by a wire cutting mechanism; if yes, one of the two wires between two adjacent LED beads is alternately cut off; If not, the wires between two adjacent LED beads are not cut off;

conveying the LED bead to a second packaging station, and packaging the LED bead and a wire end formed by cutting-off of the wire together inside the packaging adhesive body if the wires between two adjacent LED beads has been cut off;

conveying the LED bead to an ornament assembling station, placing the first housing on one side of the LED bead, and pre-buckling a second housing to the first housing to form a decorative piece, such that the LED bead is accommodated inside the decorative piece; and conveying the decorative piece to the soldering station, and soldering the first housing and the second housing together using an ultrasonic wave.

According to the present disclosure, another method for manufacturing an LED light string ornament includes:

arranging at least three wires side by side on a production line, and connecting the at least three wires together to be an integral;

conveying the at least three wires to a wire stripping station, and removing insulating layers of at least two of the at least three wires at a set interval to form a pair of opposed solder joints;

conveying the pair of solder joints to a soldering material coating station, and coating surfaces of the pair of solder joints with soldering material;

conveying the pair of solder joints the surfaces of which are coated with soldering material to an LED mounting station, and placing solder feet of a Surface Mounted Device (SMD) LED on the pair of solder joints;

conveying the SMD LED placed on the pair of solder joints to a soldering station, and soldering the solder feet of the SMD LED respectively to the pair of solder joints;

conveying the soldered SMD LED to a soldering inspection station to inspect a soldering quality of the SMD LED;

conveying the inspected SMD LED to a first packaging station, and packaging the SMD LED inside a packaging adhesive body to form an LED bead;

conveying the LED bead to a wire cutting station, and determining whether it is to cut the wire off by a wire cutting mechanism; if yes, one of the wires between two adjacent LED beads is cut off, if not, the wires between two adjacent LED beads are not cut off;

conveying the LED bead to a second packaging station, and packaging the LED bead and a wire end formed by cutting-off of the wires together inside the packaging adhesive body if one of the wires between two adjacent LED beads has been cut off;

conveying the LED bead to an ornament assembling station, placing the first housing on one side of the LED bead, and pre-buckling a second housing to the first housing to form a decorative piece, such that the LED bead is accommodated inside the decorative piece; and conveying the decorative piece to the soldering station, and soldering the first housing and the second housing together using an ultrasonic wave.

According to the method for manufacturing the LED light string ornament provided by the present disclosure, the LED light string is manufactured automatically and the decorative piece can be assembled onto the LED light string automatically, which is advantageous for reducing the labor cost, and reducing the labor intensity. The manufacturing efficiency and the product quality of the light string can be improved effectively.

Beneficial effects of the additional technical features of the present disclosure will be described in the detail description portion of the specification.

Figure 1:
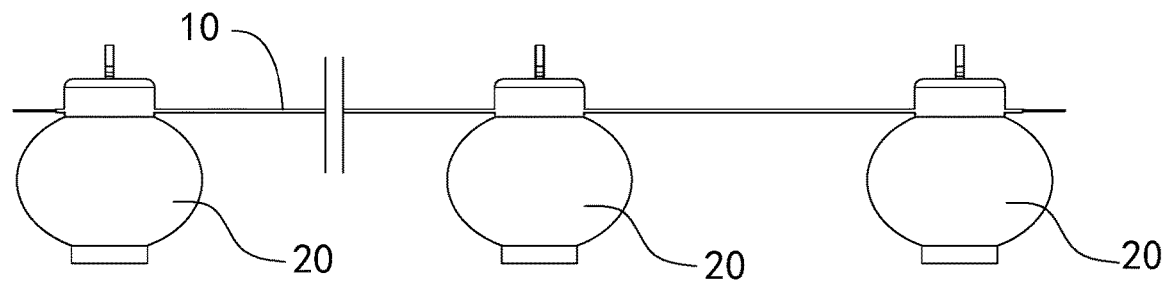
FIG. 1 is a front view of an LED light string ornament according to a first embodiment of the present disclosure.

List of Reference Numbers: 10, LED light string; 11, first wire; 12, second wire; 13, third wire; 14, SMD LED; 15, packaging adhesive body; 16, jumper wire; 17, LED bead; 18, fourth wire; 19, fifth wire; 20, decorative piece; 201, accommodating cavity; 21, first housing; 211, opening; 212, crimping recess; 213, first flange; 214, buckling slot 22, second housing; 221, crimping convex; 222, second flange; 223, hook; 224, buckle.

DETAILED DESCRIPTION OF THE EMBODIMENTS

Hereinafter, the present disclosure will be described in detail with reference to the drawings and the embodiments. It should be noted that, if there is no conflict, the following embodiments and the features in the embodiments can be combined with each other.

In the description, the directional terms such as front, back, upper, lower, etc. are defined in terms of parts in the drawings and positions between the parts in the drawings, merely for expressing the technical solution clearly and conveniently. It should be understood that use of location terms should not limit the scope of protection claimed in the present application.

FIG. 1 is a front view of an LED light string ornament according to a first embodiment of the present disclosure. As shown in FIG. 1, the LED light string ornament in this embodiment includes an LED light string 10 and a plurality of decorative pieces 20, and a part of or a whole of each of the decorative pieces 20 is transparent or semi-transparent.

Figure 2:
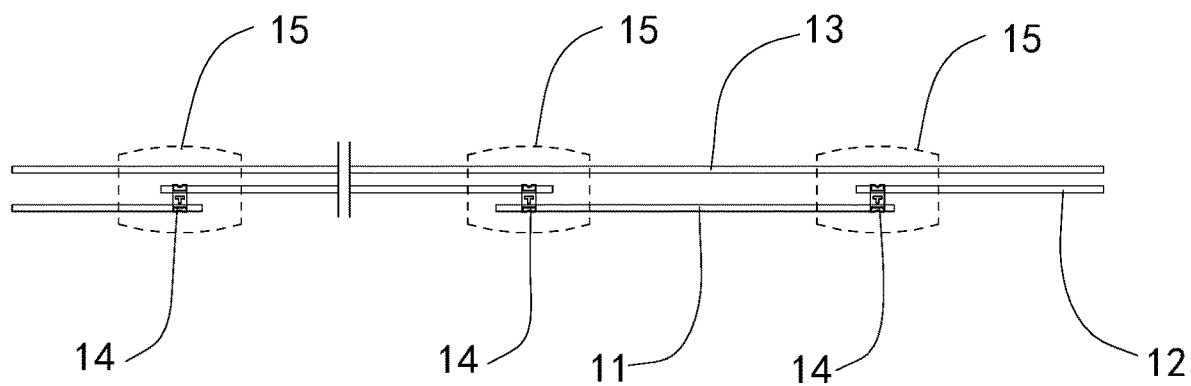
FIG. 2 is a schematic diagram illustrating a structure of an LED light string of the LED light string ornament shown in FIG. 1.

FIG. 2 is a structural diagram of the LED light string 10 of the LED light string ornament shown in FIG. 1. As shown in FIG. 2, the LED light string 10 includes a first wire 11, a second wire 12, a third wire 13, a plurality of SMD LEDs 14 and a plurality of packaging adhesive bodies 15, a first wire 11, a second wire 12 and a third wire 13 arranged side by side. The first wire 11, the second wire 12, and the third wire 13 each include a wire core (not shown) and an insulating layer (not shown) covering a surface of the wire core. The first wire 11, the second wire 12, and the third wire 13 in this embodiment may be rubber-covered wires or enameled wires. The first wire 11 and the second wire 12 are respectively formed with a plurality of first solder joints (not shown) and a plurality of second solder joints (not shown) by removing the insulating layer thereof in an axial direction thereof at an interval of a set length. Positions of the second solder joints and the first solder joints correspond to each other one by one to form a plurality of soldering light regions.

A plurality of SMD LEDs 14 are respectively arranged at the plurality of soldering light regions, and two solder feet of the SMD LED 14 are respectively soldered on the first and second solder joints of the corresponding soldering light region. Positions of positive electrodes and negative electrodes of every two adjacent SMDs 14 are oppositely arranged. The first wire 11 and the second wire 12 between every two adjacent SMD LEDs 14 are alternately cut off, that is, between previous two adjacent SMD LEDs 14 11, the first wire is cut off and the second wire 12 is not cut off; between the next two adjacent SMD LEDs 14, the first wire 11 is not cut off and the second wire 12 is cut off, and so on, so as to connect the plurality of SMD LEDs 14 in series.

A plurality of packaging adhesive bodies 15 are respectively wrapped on surfaces of the plurality of SMD LEDs 14 and a portion of the third wire 13 corresponding to a position of the plurality of SMD LEDs 14 to form a plurality of LED beads 17.

Figure 3:
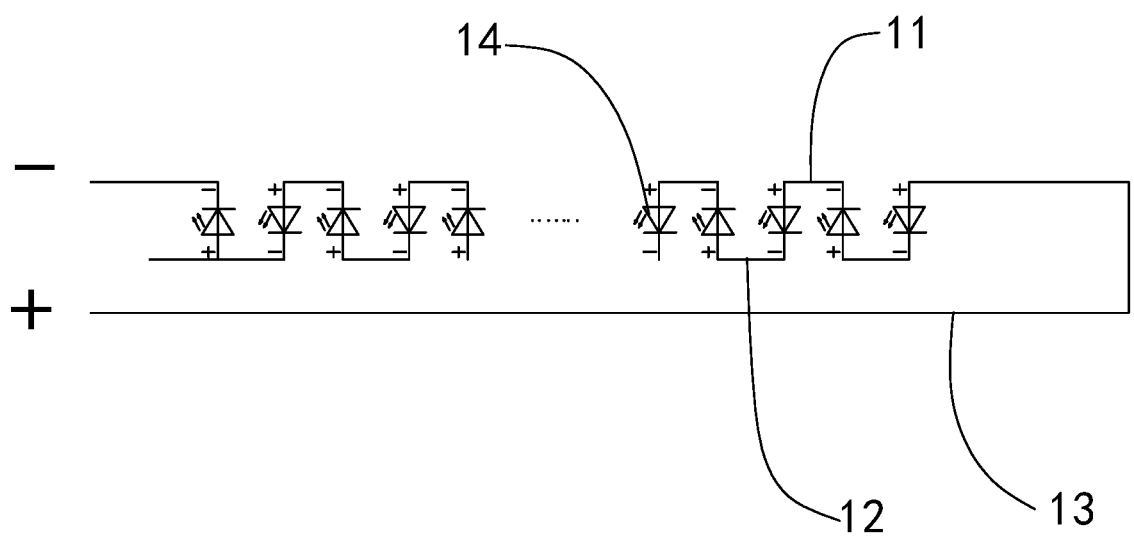
FIG. 3 is a schematic circuit diagram of the LED light string of the LED light string ornament shown in FIG. 1.

FIG. 3 is a circuit diagram of the LED light string 10 of the LED light string ornament shown in FIG. 1. When in use, one end of the first wire 11 is electrically connected to one end of the third wire 13, and the other end of the first wire 11 and the other end of the third wire 13 are respectively connected to a negative electrode and a positive electrode of a driving power source (not shown).

The LED light string 10 in this embodiment is a light string in which the plurality of SMD LEDs are connected in series. The LED light string 10 can be powered by a high-voltage power supply (such as a 220V power supply). Moreover, the third wire 13 is connected to the first wire 11 and the second wire 12 through the packaging adhesive body 15. It is advantageous for increasing a strength of the LED light string 10 and preventing the SMD LED 14 from falling off when the LED light string 10 is pulled.

Figure 4:
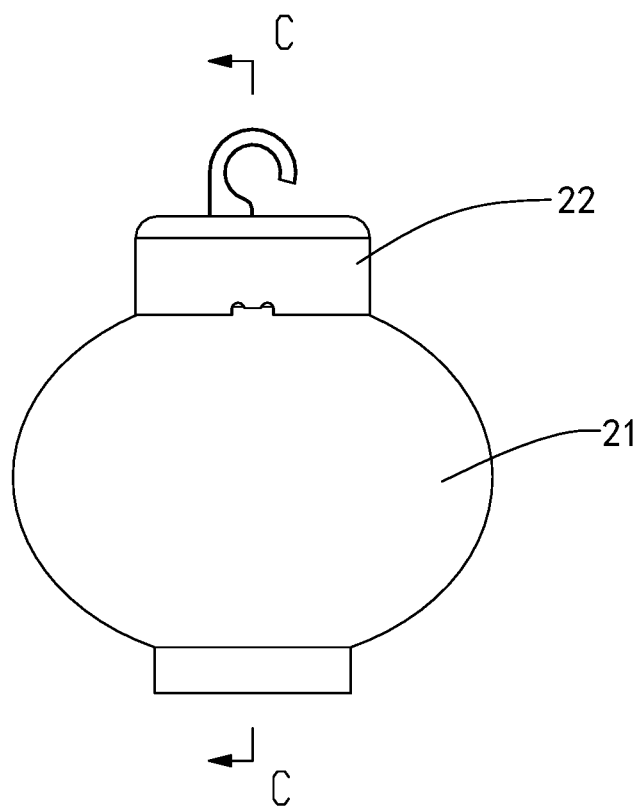
FIG. 4 is a front view of a decorative piece of the LED light string ornament shown in FIG. 1.
Figure 5:
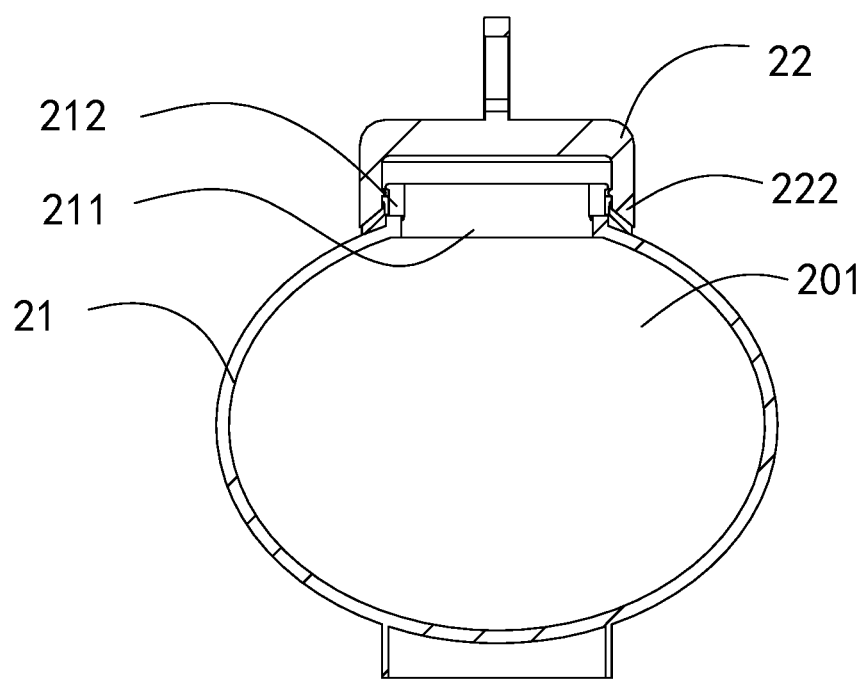
FIG. 5 is a cross-sectional view taken along C-C in FIG. 4.
Figure 6:
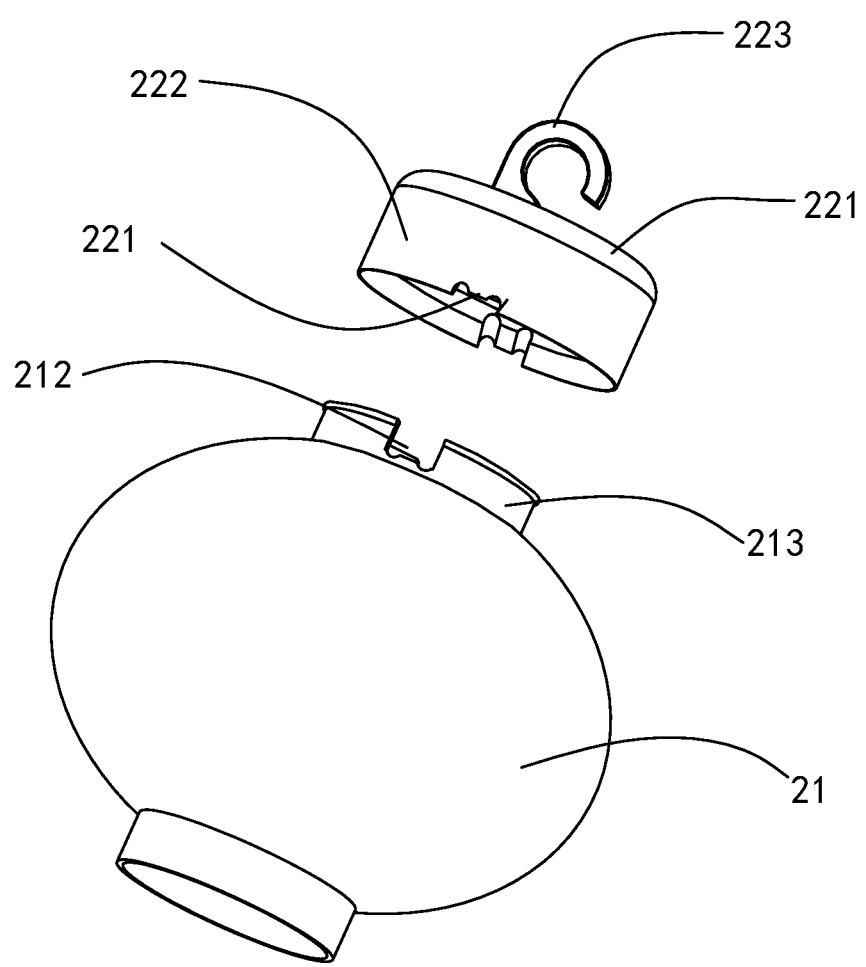
FIG. 6 is an exploded view of the decorative piece of the LED light string ornament shown in FIG. 1.
Figure 7:
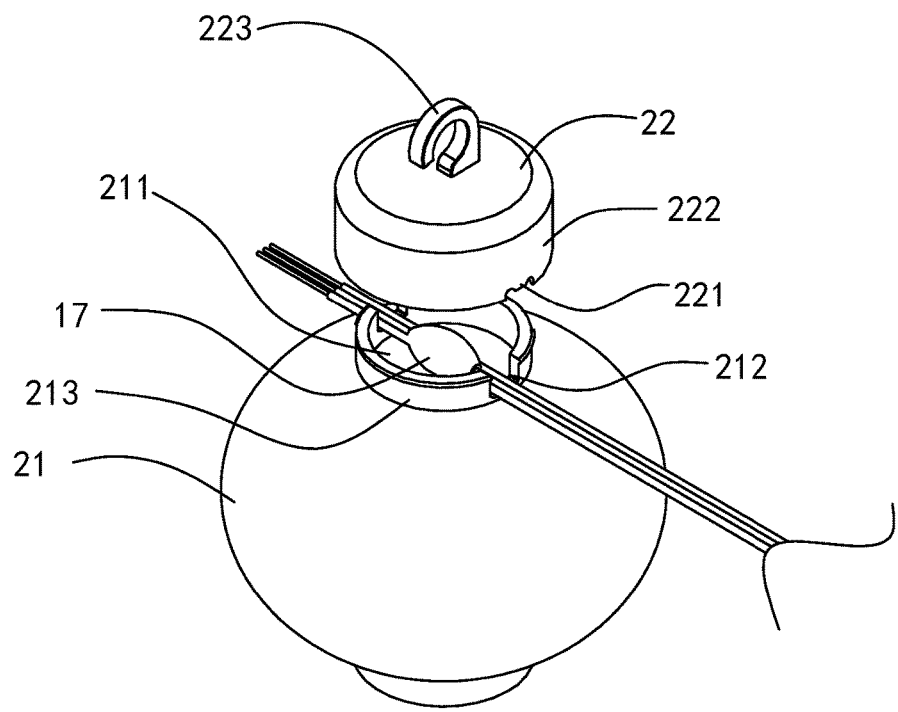
FIG. 7 is an assembly diagram of the decorative piece and the LED light string of the LED light string ornament shown in FIG. 1.

FIG. 4 is a front view of the decorative piece 20 of the LED light string ornament shown in FIG. 1. FIG. 5 is a cross-sectional view taken along C-C in FIG. 4. FIG. 6 is an exploded view of the decorative piece 20 of the LED light string ornament shown in FIG. 1. FIG. 7 is an assembly diagram of the decorative piece 20 and the LED light string 10 of the LED light string ornament shown in FIG. 1. As shown in FIGS. 4-7, the decorative piece 20 in this embodiment includes a first housing 21 and a second housing 22. The first housing 21 is made of translucent material, and the first housing 21 is an ellipsoid (or a sphere). The first housing 21 is provided with an opening 211. The second housing 22 covers the opening 211. The second housing 22 and the first housing 21 form an accommodating cavity 201 and the LED bead 17 of the LED light string 10 is accommodated in the accommodating cavity 201. The decorative piece 20 can increase the beauty of the product, and can also protect the LED beads 17. In this embodiment, the LED bead 17 is located at the opening 211 of the first housing 21, and a light-emitting surface of the SMD LED 14 on which the LED bead 17 is located faces the first housing 21.

In order to prevent water from entering the accommodating cavity 201, the first housing 21 and the second housing 22 are hermetically connected. For ease of processing, the first housing 21 and the second housing 22 are welded by ultrasonic. Welding by ultrasonic not only provides high welding efficiency, but also provides a good sealing effect, which can prevent rain and other liquids from entering an interior of the decorative piece when the product is used outdoors.

In order to fix the LED light string 10, the first housing 21 is provided with a crimping recess 212, and the second housing 22 is provided with a crimping convex 221 matched with the crimping recess 212. The first wire 11, the second wire 12, and the third wire 13 are sandwiched between the crimping recess 212 and the crimping convex 221.

In an embodiment, the first housing 21 includes a first flange 213 surrounding the opening 211, and the second housing 22 includes an annular second flange 222. An inner diameter of the second flange 222 is greater than an outer diameter of the first flange 213. The first flange 213 is inserted into the second flange 222. During processing, the first flange 213 and the second flange 222 can facilitate an alignment of the first housing 21 and the second housing 22. Moreover, the first flange 213 and the second flange 222 can increase a welding area, making the welding stronger.

In an embodiment, the opening 211 is provided at an end of a short axis of the first housing 21, and another end of the short axis of the first housing 21 is provided with a convex ring. In this way, an appearance of the decorative piece 20 is lantern-shaped.

In order to fix the light string conveniently, a hook 223 is provided on a top surface of the second housing 22.

Figure 8:
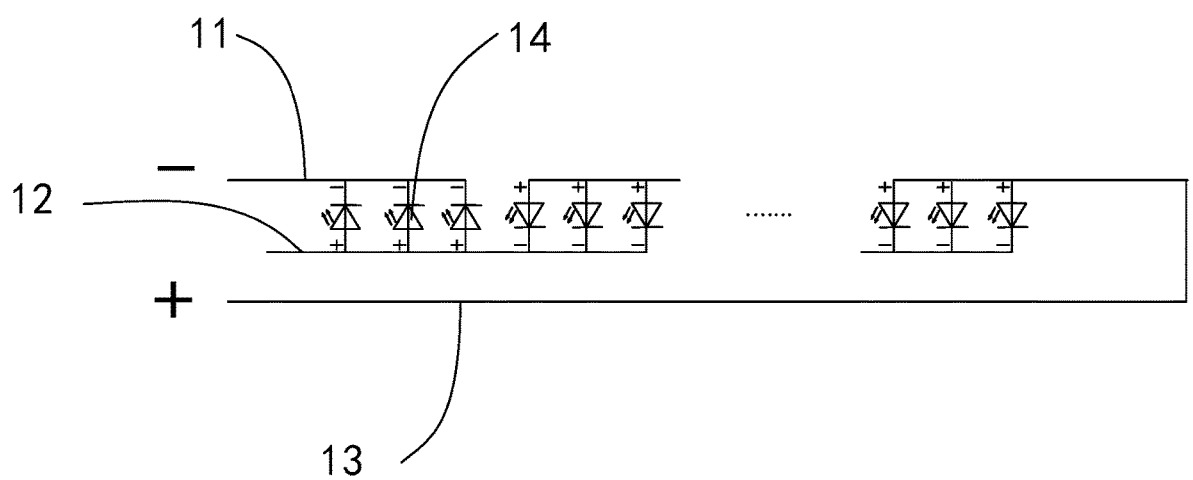
FIG. 8 is a schematic circuit diagram of the LED light string of the LED light string ornament according to a second embodiment of the present disclosure.

FIG. 8 is a schematic circuit diagram of the LED light string 10 according to a second embodiment of the present disclosure. A structure of the LED light string 10 in this embodiment is substantially the same as that of the first embodiment. The difference is that every at least two (four in this embodiment) adjacent SMD LEDs 14 form one light-emitting unit, and the SMD LEDs 14 in each light emitting unit are connected in parallel. The positions of the positive electrodes and the negative electrodes of two adjacent light-emitting units are oppositely arranged, and the first wire 11 and the second wire 12 between every two adjacent light-emitting units are alternately cut off, so that the plurality of SMD LEDs 14 are connected in the hybrid connection, that is, connected in a parallel and then in series.

The LED light string 10 in this embodiment is a light string in which the SMD LEDs are connected in the hybrid connection, which can be powered by a medium or high voltage power supply (such as an 110V power supply). Moreover, the third wire 13 is connected to the first wire 11 and the second wire 12 through the packaging adhesive body 15. It is advantageous for increasing the strength of the LED light string 10 and preventing the SMD LED 14 from falling off when the LED light string 10 is pulled.

Figure 9:
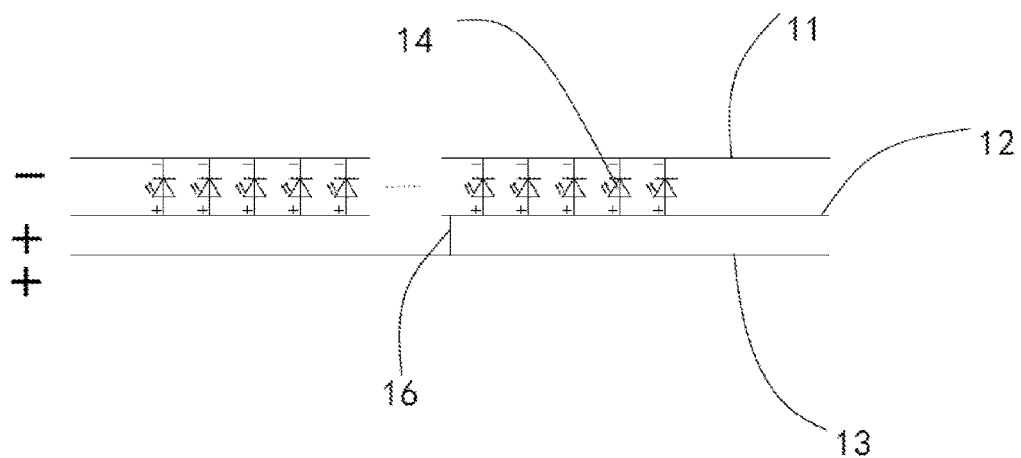
FIG. 9 is a schematic circuit diagram of the LED light string of the LED light string ornament according to a third embodiment of the present disclosure.

FIG. 9 is a schematic circuit diagram of the LED light string 10 according to a third embodiment of the present disclosure. As shown in the figure, the structure of the LED light string 10 is substantially the same as that of the LED light string 10 in the first embodiment. The difference is that the plurality of SMD LED 14 are connected in parallel through the first wire 11 and the second wire 12. The positions of positive electrodes and negative electrodes of the plurality of SMD LEDs are arranged the same as each other. The third wire 13 is connected to the first wire 11 or the second wire 12 through at least one jumper wire 16. When in use, the first wire 11 is connected to the negative electrode of the driving power source, and the second wire 12 and the third wire 13 are connected to the negative electrode of the driving power source.

The LED light string 10 in this embodiment is a light string in which the SMD LEDs are connected in parallel, which can be powered by a low voltage power supply (such as a 3V power supply). Moreover, the third wire 13 is connected in parallel with the second wire 12, which is equivalent to increasing the cross-sectional area of the second wire 12, effectively reducing the voltage attenuation, and it is advantageous for improving the light-emitting effect. Moreover, the third wire 13 is connected to the second wire 12 through the packaging adhesive body 15. It is advantageous for increasing the strength of the LED light string 10 and preventing the SMD LED 14 from falling off when the LED light string 10 is pulled.

Figure 10:
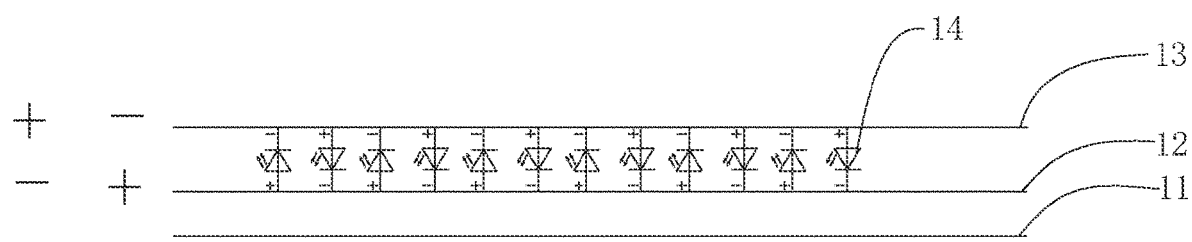
FIG. 10 is a schematic circuit diagram of the LED light string of the LED light string ornament according to a fourth embodiment of the present disclosure.

FIG. 10 is a schematic circuit diagram of the LED light string 10 according to a fourth embodiment of the present disclosure. As shown in the figure, the structure of the LED light string 10 is substantially the same as that of the LED light string 10 in the third embodiment. The difference is that the positions of positive electrodes and negative electrodes of the plurality of SMD LEDs are oppositely arranged. The LED light string 10 provided by the present disclosure is a light string in which the SMD LEDs are connected in parallel, and a power supply of 3V can be supplied alternately to realize an alternately flashing of the light string.

Figure 11:
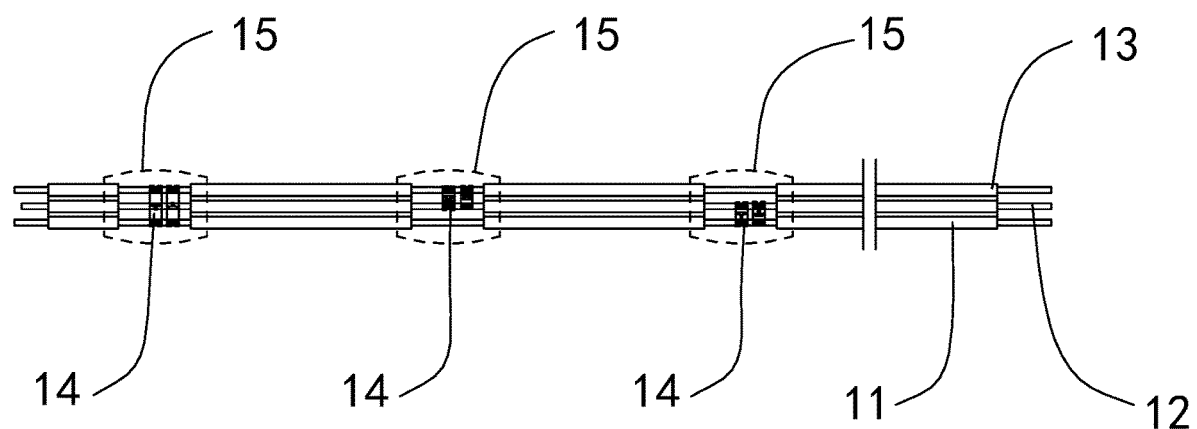
FIG. 11 is a schematic diagram of the structure of the LED light string of the LED light string ornament according to a fifth embodiment of the present disclosure.
Figure 12:
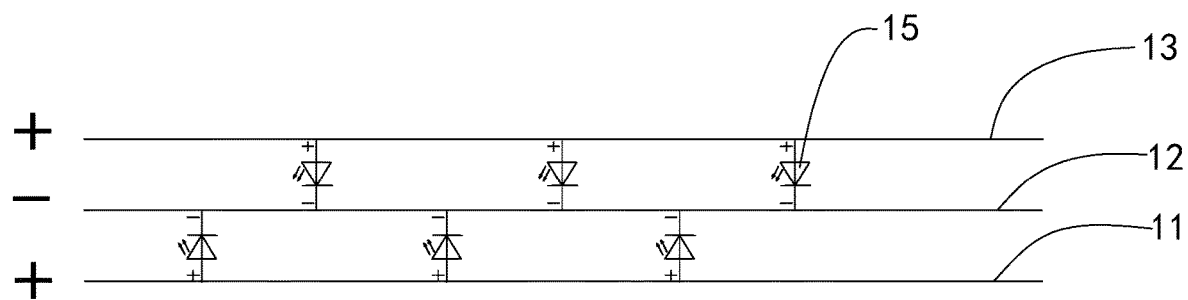
FIG. 12 is a schematic circuit diagram of the LED light string of the LED light string ornament according to the fifth embodiment of the present disclosure.

FIG. 11 is a schematic diagram of the structure of the LED light string of the LED light string ornament according to a fifth embodiment of the present disclosure, and FIG. 12 is a circuit schematic diagram of the LED light string of the LED light string ornament according to the fifth embodiment the present disclosure. As shown in FIGS. 11 and 12, the structure of the LED light string 10 in this embodiment is substantially the same as that of the LED light string 10 in the first embodiment. The difference is that the first wire, the second wire 12 and the third wire 13 of the LED light string 10 in this embodiment 11 are rubber-covered wires, and the insulating layers of the first wire 11, the second wire 12 and the third wire 13 are connected together. The first wire 11 and the second wire 12 are formed with a plurality of pairs of opposed first solder joints by removing the insulating layer thereof in an axial direction thereof at an interval of a set length, the second wire 12 and the third wire 13 are formed with a plurality of pairs of opposed second solder joints by removing the insulating layer thereof in an axial direction thereof at an interval of a set length. The plurality of pairs of first solder joints and the plurality of pairs of second solder joints are arranged at intervals one by one in the axial direction of the wire. The two solder feet of each of a part of the plurality of SMD LEDs 14 are respectively soldered to two first solder joints of the plurality of pairs of first solder joints, and positions of positive electrodes and negative electrodes of the part of the plurality of SMD LEDs 14 are arranged the same as each other. The two solder feet of each of a remain part of the plurality of SMD LEDs 14 are respectively soldered to two second solder joints of the plurality of pairs of second solder joints, and positions of positive electrodes and negative electrodes of the remain part of the plurality of SMD LEDs 14 are arranged the same as each other.

According to the LED light string ornament in this embodiment, the second wire 12 is a common wire end, and the power supply of 3V is supplied alternately or simultaneously to realize alternately flashing of the light string or the light string always on.

Figure 13:
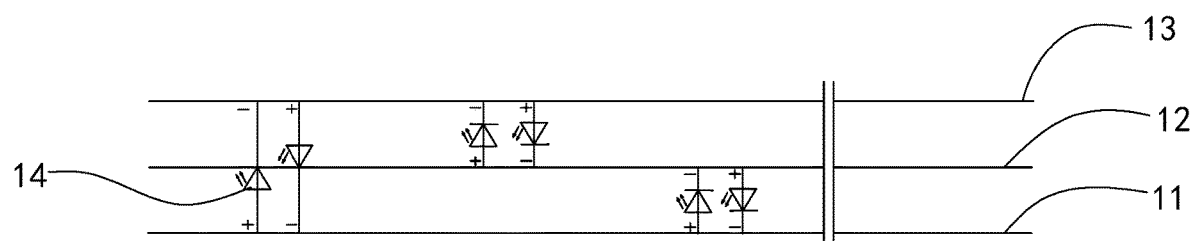
FIG. 13 is a circuit diagram of the LED light string of the LED light string ornament according to a sixth embodiment of the present disclosure.

FIG. 13 is a circuit diagram of the LED light string of the LED light string ornament according to a sixth embodiment of the present disclosure. As shown in FIG. 13, the structure of the LED light string 10 in this embodiment is substantially the same as that of the LED light string 10 in the fifth embodiment. The difference is that the first wire 11 and the second wire 12 are formed with a plurality of pairs of opposed first solder joints by removing the insulating layer thereof in an axial direction thereof at an interval of a set length, and every two adjacent pairs of the first solder joints form a group. The second wire 12 and the third wire 13 are formed with a plurality of pairs of opposed second solder joints by removing the insulating layer thereof in an axial direction thereof at an interval of a set length, and every two adjacent pairs of the second solder joints forms a group. The first wire 11 and the third wire 13 are formed with a plurality of pairs of opposed third solder joints by removing the insulating layer thereof in an axial direction thereof at an interval of a set length, and every two adjacent pairs of the third solder joints forms a group. Each group of the first solder joints, each group of the second solder joints, and each group of the third solder joints are arranged at intervals one by one in the axial direction of the wire. Every two SMD LEDs 14 form a group, and positions of positive electrodes and negative electrodes of each group of the SMD LEDs 14 are oppositely arranged. The solder feet of two SMD LEDs 14 in each group of the SMD LEDs are soldered to solder joints in each group of the first solder joints or each group of the second solder joints or each group of the third solder joints.

The LED light string ornament in this embodiment is a three-wire six-way LED light string. When in use, a programmable control voltage is used to realize the light string can be programmed to flashing or always on.

Figure 14:
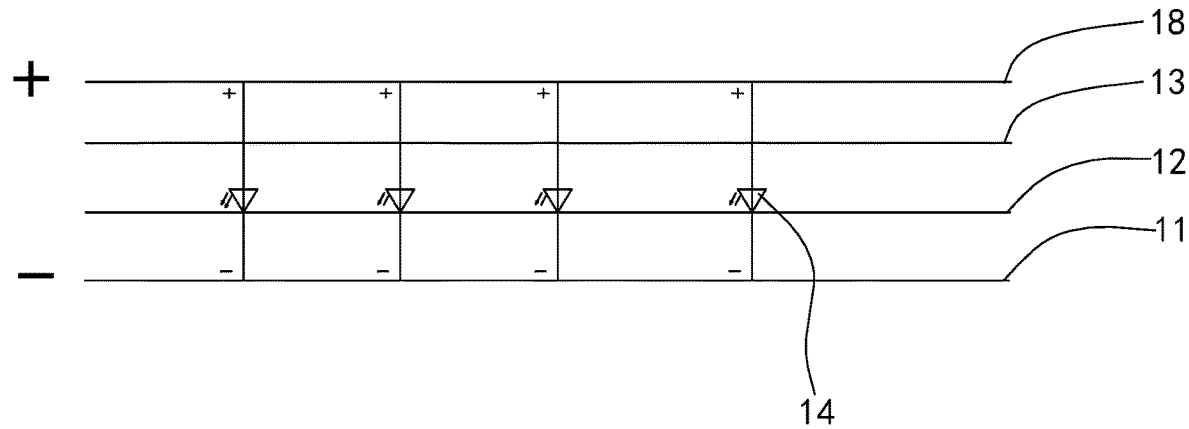
FIG. 14 is a schematic circuit diagram of the LED light string of the LED light string ornament according to a seventh embodiment of the present disclosure.

FIG. 14 is a circuit diagram of the LED light string of the LED light string ornament according to a seventh embodiment of the present disclosure. As shown in FIG. 14, the structure of the LED light string 10 in this embodiment is substantially the same as that of the LED light string 10 in the fifth embodiment. The difference is that the LED light string 10 includes the first wire 11, the second wire 12, the third wire 13 and the fourth wire 18. The first wire 11, the second wire 12, the third wire 13 and the fourth wire 18 are formed with a plurality of pairs of opposed solder joints by removing the insulating layer thereof in an axial direction thereof at an interval of a set length. The SMD LEDs 14 are a plurality of RGB LEDs. The four solder feet of the plurality of RGB LEDs are respectively soldered to four soldering joints of the plurality of pairs of the solder joints.

In the LED light string ornament according to this embodiment, the RGB LED is a programmable LED bead. The LED bead is provided with a built-in IC that can burn programs and can emit a variety of colors. After the LED bead is soldered to the wire, the power supply controls flashing and going-off the LED beads through the second wire 12 (control signal wire) and the third wire 13 (control signal wire), and the LED beads emit light of different colors based on the different signal.

Figure 15:
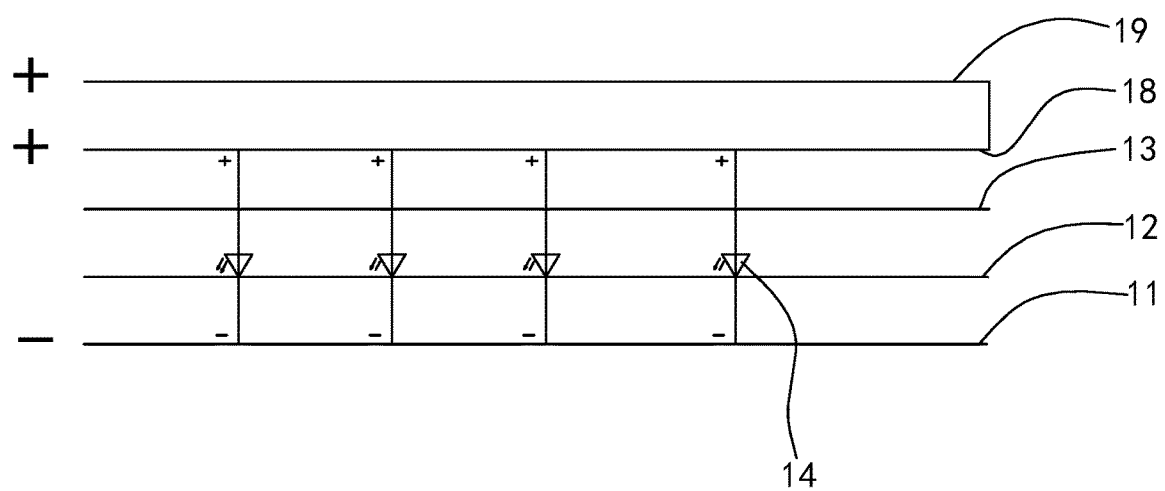
FIG. 15 is a schematic circuit diagram of the LED light string of the LED light string ornament according to an eighth embodiment of the present disclosure.
Figure 16:
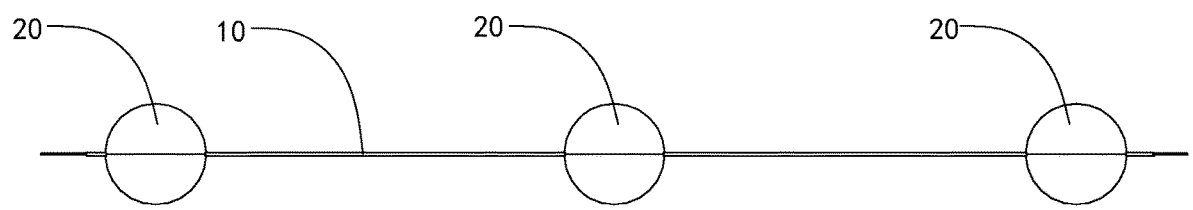
FIG. 16 is a front view of the LED light string ornament according to a ninth embodiment of the present disclosure.
Figure 17:
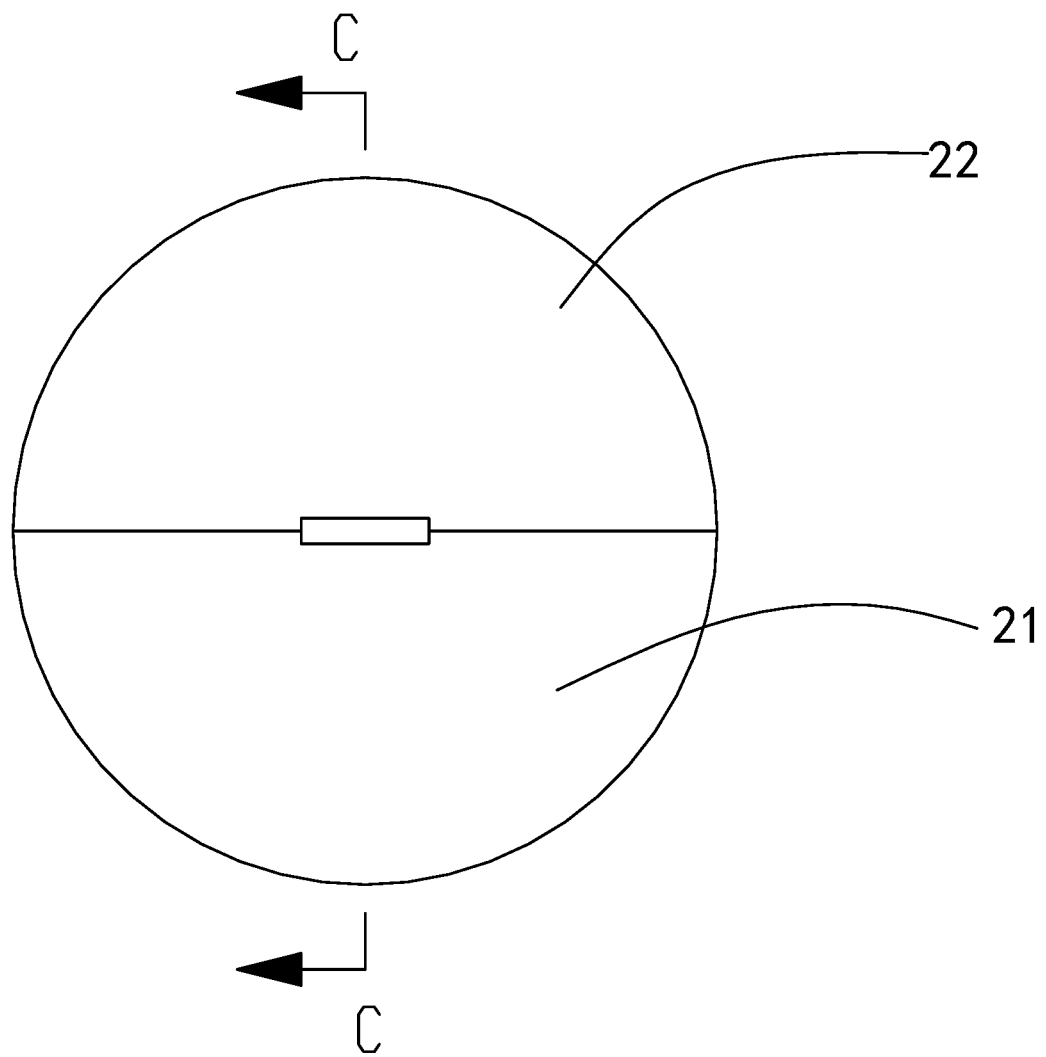
FIG. 17 is a front view of the decorative piece of the LED light string ornament shown in FIG. 16.
Figure 18:
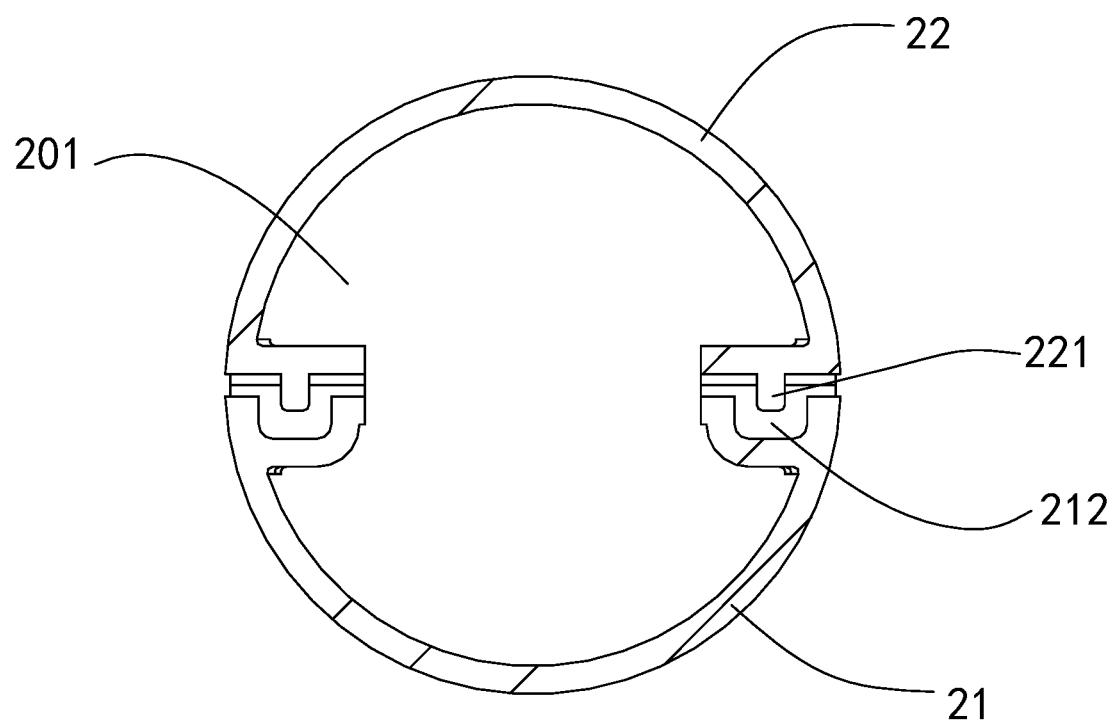
FIG. 18 is a sectional view taken along C-C in FIG. 17.
Figure 19:
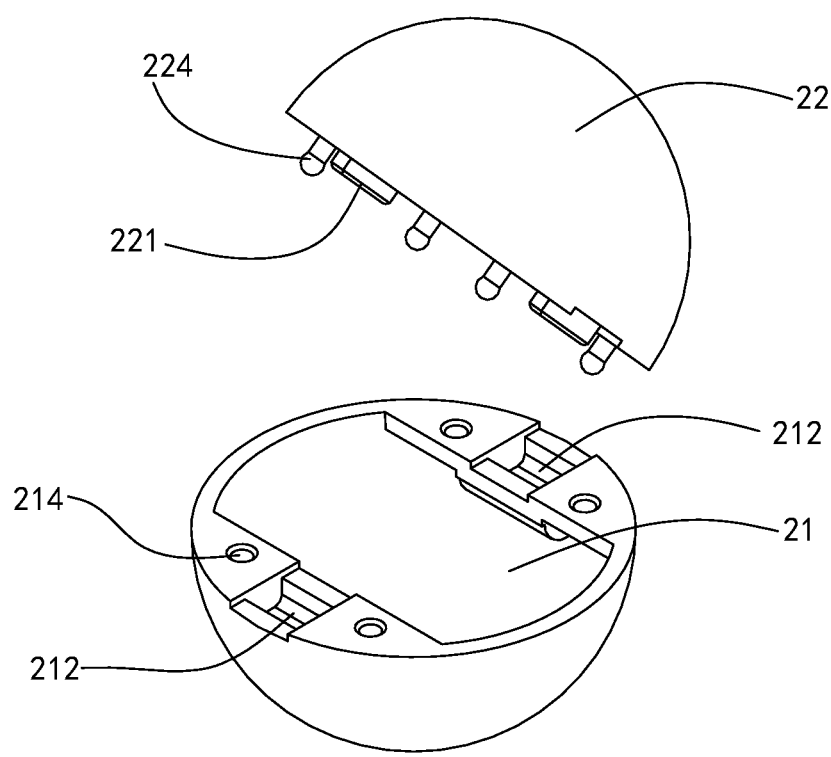
FIG. 19 is an exploded view of the decorative piece of the LED light string ornament shown in FIG. 16.
Figure 20:
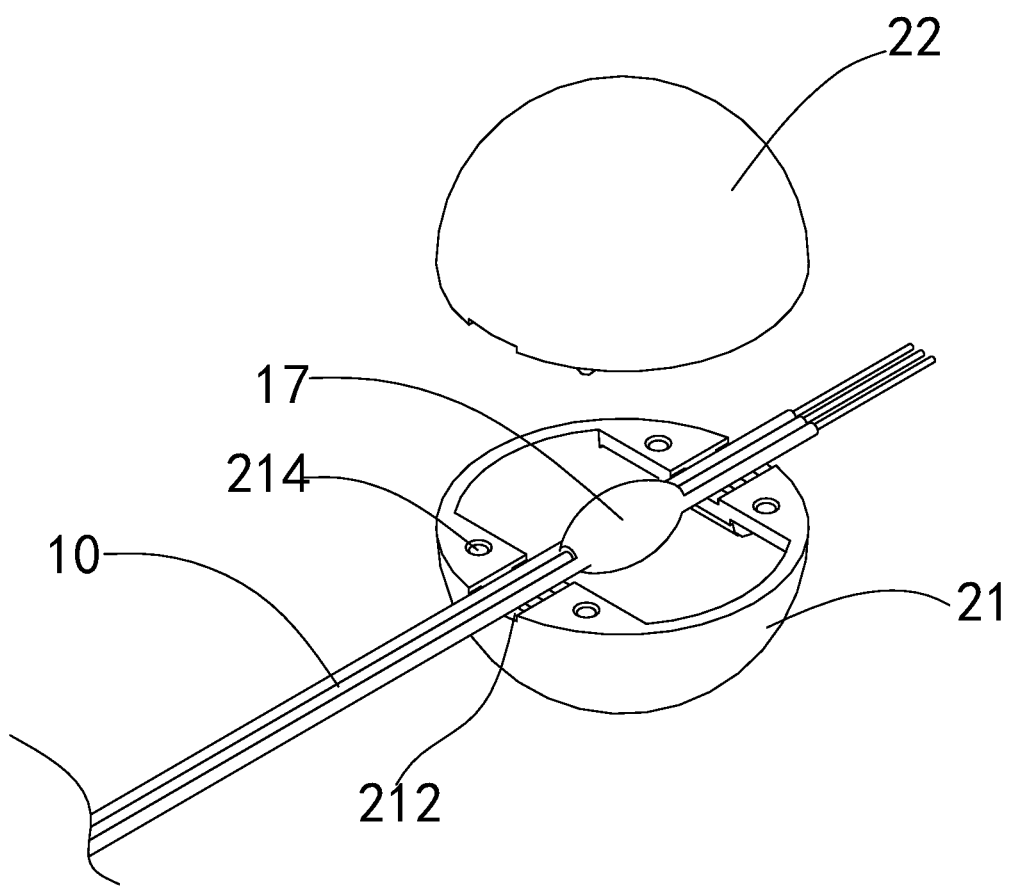
FIG. 20 is an assembly diagram of the decorative piece and the LED light string of the LED light string ornament shown in FIG. 16.

FIG. 15 is a schematic circuit diagram of the LED light string of the LED light string ornament according to an eighth embodiment of the present disclosure. As shown in FIG. 15, the structure of the LED light string 10 in this embodiment is substantially the same as that of the LED light string 10 in the seventh embodiment. The difference is that the LED light string 10 in this embodiment also includes a fifth wire 19, and the fifth wire 19 is connected in parallel with the fourth wire 18.

In the LED light string ornament according to this embodiment, the fifth wire 19 is added, and the fifth wire 19 is connected to an end of the fourth wire 18, which can reduce the voltage attenuation and increase the length of the light string.

As shown in FIGS. 16-20, the structure of the LED light string ornament in this embodiment is substantially the same as that of the LED light string ornament in the first embodiment. The difference is that the first housing 21 is a hemisphere, the second housing 22 is a hemisphere, and the first housing 21 and the second housing 22 are buckled to form a sphere.

In an embodiment, the first housing 21 is provided with at least one buckling slot 214, and the second housing 22 is provided with at least one buckle 224 matched with the at least one slot buckling 214, and the buckle 224 is buckled into the buckling slot 214. During processing, the buckle 224 and the buckling slot 214 can facilitate alignment of the first housing 21 and the second housing 22. Moreover, the buckle 224 and the buckling slot 214 can make the connection between the first housing 21 and the second housing 22 stronger.

Figure 21:
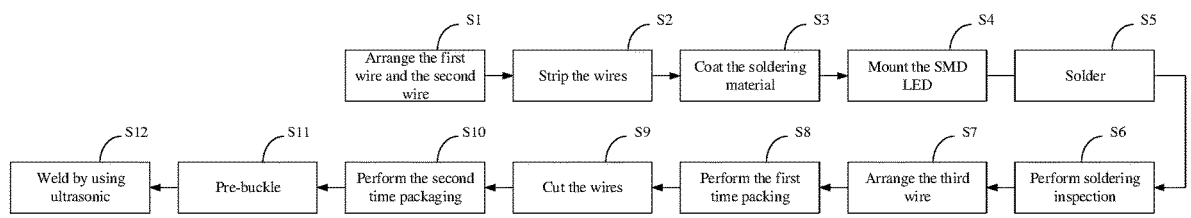
FIG. 21 is a flow chart of a method for manufacturing the LED light string ornament according to an embodiment of the present disclosure.

According to another embodiment of the present disclosure, a method for manufacturing an LED light string ornament is provided. The method for manufacturing the LED light string ornament in this embodiment is suitable for manufacturing the LED light string ornament with the enameled wire. As shown in FIG. 21, the method includes the following steps.

In step S1, the first wire 11 and the second wire 12 are arranged on a production line. The first wire 11 and the second wire 12 are provided side by side through the first wire and the second wire providing mechanism.

In step S2, the wires are stripped. The first wire 11 and the second wire 12 are conveyed to a wire stripping station by a wire conveying mechanism, and the insulating layer on the surface of each of the first wire 11 and the second wire 12 is removed by a wire stripping mechanism at a set interval to form the first solder joint and the second solder joint. The position of the first solder joint corresponds to the position of the second solder joint.

In step S3, soldering material is coated. The first solder joint and the second solder joint are conveyed to a soldering material coating station by the wire conveying mechanism, and the surfaces of the first solder joint and the second solder joint of the first wire 11 and the second wire 12 are coated with the soldering material. The soldering material in this embodiment is solder paste.

In step S4, the SMD LED 14 is mounted. The first solder joint and the second solder joint the surfaces of which are coated with the soldering material are conveyed to an LED mounting station by the wire conveying mechanism. The two solder feet of the SMD LED 14 are respectively mounted onto the first solder joint and the second solder joint by an LED placement mechanism.

In step S5, the SMD LED 14 is soldered. The SMD LED 14 placed on the first solder joint and the second solder joint are conveyed to a soldering station by the wire conveying mechanism. The two solder feet of the SMD LED 14 are respectively soldered to the first solder joint and the second solder joint of the first wire 11 and the second wire 12 by a soldering mechanism.

In step S6, soldering is inspected. The soldered SMD LED 14 is conveyed to a soldering inspection station by the wire conveying mechanism, and a soldering quality of the SMD LED 14 is inspected by a soldering inspection mechanism.

In step S7, the third wire 13 is provided side by side with the first wire 11 and the second wire 12 by a third wire 13 providing mechanism.

In step S8, a first time packaging is performed. The third wire 13 and the inspected SMD LED 14 are conveyed to a first packaging station by the wire conveying mechanism. The SMD LED 14 and a portion of the third wire 13 corresponding to a position of the SMD LED 14 are packaged inside a packaging adhesive body 15 to form an LED bead 17 by a first packaging mechanism.

In step S9, the wires are cut off. The LED beads 17 are conveyed to a wire cutting station by the wire conveying mechanism. Whether it is to cut the wire off is determined by a wire cutting mechanism. If yes, the first wire 11 or the second wire 12 between two adjacent SMD LEDs 14 is cut off. If not, the first wire 11 or the second wire 12 between two adjacent LED beads 17 is not cut off.

In step S10, a second time packaging is performed. The LED bead 17 is conveyed to a second packaging station by the wire conveying mechanism. If the first wire 11 or the second wire 12 between two adjacent LED beads 17 has been cut off, the packaging adhesive body 15 and a wire end formed by the cutting-off of the first wire 11 or the second wire 12 is packaged inside the packaging adhesive body 15 by a second packaging mechanism.

In step S11, the LED bead 17 is conveyed to an ornament assembling station by the wire conveying mechanism. The first housing 21 is placed on one side of the LED bead 17, and then the second housing 22 and the first housing 21 are pre-buckled to form the decorative piece 20, so that the LED bead 17 is accommodated inside the decorative piece 20. Specifically, the first housing 21 is automatically fed by the first housing 21 feeding mechanism, and the first housing 21 feeding mechanism includes a vibration plate and a positioning clamp. The second housing 22 is automatically fed by a second housing 22 feeding mechanism, and the second housing 22 feeding mechanism of includes a vibrating plate and a positioning clamp. Then a manipulator is moved in an XYZ three-axis movement, and the second housing 22 is adsorbed and moved to a station of the first housing 21 to realize the assembling process of pre-buckling.

In step S12, the decorative piece 20 is conveyed to a welding station, and the first housing 21 and the second housing 22 are welded together using ultrasonic.

According to the method for manufacturing the LED light string ornament provided by the present disclosure, the LED light string ornament in which the SMD LED are connected in series, in parallel or in hybrid connection can be manufactured. The light string in the manufactured LED light string ornament can be supplied by high voltage or low voltage power supply, boarding power supply condition for the LED light string ornament, and broadening use occasions of the LED light string ornament. Moreover, the first housing 21 and the second housing 22 of the decorative piece 20 are welded using ultrasonic, resulting in a beautiful appearance, and a fast welding speed, which greatly improves the manufacturing efficiency.

Figure 22:
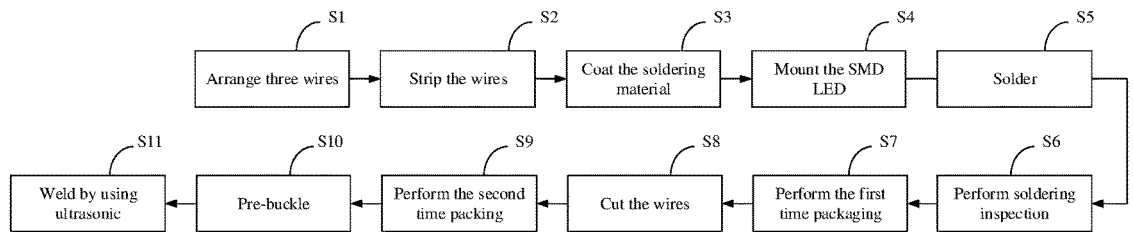
FIG. 22 is a flow chart of a method for manufacturing the LED light string ornament according to another embodiment of the present disclosure.

FIG. 22 shows the method for manufacturing the LED light string ornament according to another embodiment of the present disclosure. The method for manufacturing the LED light string ornament in this embodiment is suitable for manufacturing the LED light string ornament with rubber-covered wire. The number of the wires can be three or more, and three wires are used as an example for description. As shown in FIG. 22, the method for manufacturing the LED light string ornament includes the following steps.

In step S1, the first wire 11, the second wire 12 and the third wire 13 are arranged on a production line.

In step S2, the wires are stripped. The first wire 11, the second wire 12, and the third wire 13 are conveyed to a wire stripping station by a wire conveying mechanism, and the insulating layer on the surface of each of the first wire 11 and the second wire 12 is removed by a wire stripping mechanism at a set interval to form the opposed first solder joint and second solder joint, and/or the insulating layer on the surface of each of the first wire 11 and the third wire 13 is removed by the wire stripping mechanism at a set interval to form the opposed first solder joint and third solder joint, and/or the insulating layer on the surface of each of the second wire 12 and the third wire 13 is removed by a wire stripping mechanism at a set interval to form the opposed second solder joint and third solder joint.

Step S3, soldering material is coated. The first solder joint and the second solder joint and/or the first solder joint and the third solder joint and/or the second solder joint and the third solder joint are conveyed to a soldering material coating station by the wire conveying mechanism, and the surface of the first solder joint and the second solder joint and/or the first solder joint and the third solder joint and/or the second solder joint and the third solder joint are coated with the soldering material. The soldering material in this embodiment is solder paste.

In step S4, the SMD LED 14 is mounted. The first solder joint and the second solder joint and/or the first solder joint and the third solder joint and/or the second solder joint and the third solder joint with the soldering material coated on the surface are conveyed to an LED mounting station by the wire conveying mechanism. The two solder feet of the SMD LED 14 are respectively mounted onto are respectively mounted on the first solder joint and the second solder joint or the first solder joint and the third solder joint or the second solder joint and the third solder joint by an LED placement mechanism.

In step S5, the SMD LED 14 is soldered. The SMD LED 14 placed on the first solder joint and the second solder joint or the first solder joint and the third solder joint and/or the second solder joint and the third solder joint are conveyed to a soldering station by the wire conveying mechanism. The two solder feet of the SMD LED 14 are respectively soldered to the first solder joint and the second solder joint or the first joint and the third joint or the second joint and the third joint by a soldering mechanism.

In step S6, soldering is inspected. The soldered SMD LED 14 is conveyed to a soldering inspection station by the wire conveying mechanism, and a soldering quality of the SMD LED 14 is inspected by a soldering inspection mechanism.

In step S7, a first time packaging is performed. The inspected SMD LED 14 is conveyed to a first packaging station by the wire conveying mechanism, and the SMD LED 14 is packaged inside the packaging adhesive body 15 to form an LED bead 17 by a first packaging mechanism.

In step S8, the wires are cut off. The LED beads 17 are conveyed to a wire cutting station by the wire conveying mechanism. Whether it is to cut the wire off is determined by a wire cutting mechanism. If yes, one of the wires between two adjacent SMD LEDs 14 is cut off. If not, the wires between two adjacent LED beads 17 are not cut off.

In step S9, a second time packaging is performed. The LED bead 17 is conveyed to a second packaging station by the wire conveying mechanism. If one of the wires between two adjacent LED beads 17 has been cut off, the packaging adhesive body 15 and a wire end formed by the cutting-off of the wire is packaged inside the packaging adhesive body 15 by a second packaging mechanism.

In step S10, the LED bead 17 is conveyed to an ornament assembling station by the wire conveying mechanism. The first housing 21 is placed on one side of the LED bead 17, and then the second housing 22 and the first housing 21 are pre-buckled to form the decorative piece 20, so that the LED bead 17 is accommodated inside the decorative piece 20. Specifically, the first housing 21 is automatically fed by the first housing 21 feeding mechanism, and the first housing 21 feeding mechanism includes a vibration plate and a positioning clamp. The second housing 22 is automatically fed by a second housing 22 feeding mechanism, and the second housing 22 feeding mechanism of includes a vibrating plate and a positioning clamp. Then a manipulator is moved in an XYZ three-axis movement, and the second housing 22 is adsorbed and moved to a station of the first housing 21 to realize the assembling process of pre-buckling.

Step S11, the decorative piece 20 is conveyed to a welding station, and the first housing 21 and the second housing 22 are welded together using ultrasonic.

The above examples only illustrate several embodiments of the present disclosure, and the descriptions are more specific and detailed, but they should not be understood as a limitation to the scope of the present disclosure. It should be pointed out that for those of ordinary skill in the art, without departing from the concept of the present disclosure, several modifications and improvements can be made, and these all fall within the protection scope of the present disclosure.

What is claimed is:

1. An LED light string ornament, comprising:
   a Light-Emitting Diode (LED) light string, comprising at least three wires, a plurality of Surface Mounted Device (SMD) LEDs, and a plurality of packaging adhesive bodies, wherein the at least three wires are arranged side by side or twisted together; the wire comprises a wire core and an insulating layer covering a surface of the wire core; at least two of the at least three wires are formed with a plurality of pairs of opposed solder joints by removing the insulating layer of the at least two wires in an axial direction of the at least two wires at an interval of a set length; each solder foot of the plurality of SMD LEDs is soldered to each solder joint of the plurality of pairs of the solder joints respectively to connect the plurality of SMD LEDs in parallel, in series or in a hybrid connection, and the plurality of packaging adhesive bodies are respectively wrapped on surfaces of the plurality of SMD LEDs to form a plurality of LED beads; and
   a plurality of decorative pieces, wherein a part or a whole of the decorative piece is transparent or semi-transparent; the decorative piece comprises a first housing and a second housing; the first housing and the second housing are buckled to form an accommodating cavity; the plurality of LED beads of the LED light string are respectively accommodated in the accommodating cavities of the plurality of decorative pieces,
   wherein the first housing is a shape of sphere or ellipsoid; the first housing is provided with an opening, and the LED bead is located at the opening; a light-emitting surface of the SMD LED of the LED bead faces the first housing; the second housing covers the opening.

2. The LED light string ornament of claim 1, wherein the LED light string comprises a first wire, a second wire, and a third wire; the first wire and the second wire are formed with a plurality of pairs of opposed solder joints by removing the insulating layer of the first wire and the second wire in an axial direction of the first wire and the second wire at an interval of a set length; two solder feet of each of the plurality of SMD LEDs are respectively soldered to two solder joints of each of the plurality of pairs of solder joints; positions of positive electrodes and negative electrodes of every two adjacent SMD LEDs are oppositely arranged, and the first wire and the second wire between every two adjacent SMD LEDs are alternately cut off, so that the plurality of SMD LEDs are connected in series; a wire end formed by cutting the first wire and the second wire off is packaged inside the packaging adhesive body.

3. The LED light string ornament of claim 1, wherein the LED light string comprises a first wire, a second wire, and a third wire; the first wire and the second wire are formed with a plurality of pairs of opposed solder joints by removing the insulating layer of the first wire and the second wire in an axial direction of the first wire and the second wire at an interval of a set length; two solder feet of each of the plurality of SMD LEDs are respectively soldered to two solder joints of each of the plurality of pairs of solder joints; every at least two adjacent SMD LEDs form one light-emitting unit; positions of positive electrodes and negative electrodes of the SMD LEDs are arranged the same as each other in each light-emitting unit, and the positions of positive electrodes and negative electrodes of every two adjacent light-emitting units are oppositely arranged; the first wire and the second wire between every two light-emitting units are alternately cut off, so that the plurality of SMD LEDs are connected in the hybrid connection; a wire end formed by cutting-off of the first wire and the second wire is packaged inside the packaging adhesive body.

4. The LED light string ornament of claim 1, wherein the LED light string comprises a first wire, a second wire, and a third wire; the first wire and the second wire are formed with a plurality of pairs of opposed solder joints by removing the insulating layer of the first wire and the second wire in an axial direction of the first wire and the second wire at an interval of a set length; two solder feet of each of the plurality of SMD LEDs are respectively soldered to two solder joints of each of the plurality of pairs of solder joints; positions of positive electrodes and negative electrodes of the plurality of SMD LEDs are oppositely arranged or arranged the same as each other, so that the plurality of SMD LEDs are connected in parallel or in positive to negative alternating parallel; and the third wire is electrically connected to the first wire or the second wire through at least one jumper wire.

5. The LED light string ornament of claim 1, wherein the LED light string comprises a first wire, a second wire, and a third wire; the first wire and the second wire are formed with a plurality of pairs of opposed first solder joints by removing the insulating layer of the first wire and the second wire in an axial direction of the first wire and the second wire at an interval of a set length, and the second wire and the third wire are formed with a plurality of pairs of opposed second solder joints by removing the insulating layer of the second wire and the third wire in an axial direction of the second wire and the third wire at an interval of a set length; the plurality of pairs of first solder joints and the plurality of pairs of second solder joints are arranged at intervals one by one in the axial direction of the wire; the two solder feet of each of a part of the plurality of SMD LEDs are respectively soldered to two first solder joints of the plurality of pairs of first solder joints, and positions of positive electrodes and negative electrodes of the part of the plurality of SMD LEDs are arranged the same as each other; the two solder feet of each of a remain part of the plurality of SMD LEDs are respectively soldered to two second solder joints of the plurality of pairs of second solder joints, and positions of positive electrodes and negative electrodes of the remain part of the plurality of SMD LEDs are arranged the same as each other.

6. The LED light string ornament of claim 1, the LED light string comprises a first wire, a second wire, and a third wire; the first wire and the second wire are formed with a plurality of pairs of opposed first solder joints by removing the insulating layer of the first wire and the second wire in an axial direction of the first wire and the second wire at an interval of a set length, and every two adjacent pairs of the first solder joints form a group; the second wire and the third wire are formed with a plurality of pairs of opposed second solder joints by removing the insulating layer of the second wire and the third wire in an axial direction of the second wire and the third wire at an interval of a set length, and every two adjacent pairs of the second solder joints form a group; the first wire and the third wire are formed with a plurality of pairs of opposed third solder joints by removing the insulating layer of the first wire and the third wire in an axial direction of the first wire and the third wire at an interval of a set length, and every two adjacent pairs of the third solder joints form a group; each group of the first solder joints, each group of the second solder joints, and each group of the third solder joints are arranged at intervals one by one in the axial direction of the wire; every two adjacent SMD LEDs form a group, and positions of positive electrodes and negative electrodes of each group of the SMD LEDs are oppositely arranged; the solder feet of two SMD LEDs in each group of the SMD LEDs are soldered to solder joints in each group of the first solder joints or each group of the second solder joints or each group of the third solder joints.

7. The LED light string ornament of claim 1, wherein the LED light string comprises a first wire, a second wire, a third wire and a fourth wire;
the first wire, the second wire, the third wire, and the fourth wire are formed with a plurality of pairs of opposed solder joints by removing the insulating layer of the first wire, the second wire, the third wire, and the fourth wire in an axial direction of the first wire, the second wire, the third wire, and the fourth wire at an interval of a set length; the plurality of SMD LEDs are a plurality of RGB LEDs; four solder feet of each of the plurality of RGB LEDs are respectively soldered to four solder joints of the plurality of pairs of the solder joints.

8. The LED light string ornament of claim 7, wherein the LED light string further comprises a fifth wire, and the fifth wire is electrically connected to the fourth wire through at least one jumper wire.

9. The LED light string ornament of claim 1, wherein one of the first housing and the second housing is provided with a crimping recess, and the other one of the first housing and the second housing is provided with a crimping convex matched with the crimping recess, and at least three of the wires are sandwiched between the crimping recess and the crimping convex.

10. The LED light string ornament of claim 1, wherein the first housing and the second housing are both shapes of hemisphere, and the first housing and the second housing are buckled to form a sphere.

11. A method for manufacturing a Light-Emitting Diode (LED) light string ornament, comprising:
- arranging two wires side by side on a production line;
- conveying the two wires to a wire stripping station, and removing insulating layers of the two wires at a set interval to form a pair of opposed solder joints;
- conveying the pair of solder joints to a soldering material coating station, and coating surfaces of the pair of solder joints with soldering material;
- conveying the pair of solder joints the surfaces of which are coated with soldering material to an LED mounting station, and placing two solder feet of a Surface Mounted Device (SMD) LED on the pair of solder joints;
- conveying the SMD LED placed on the pair of solder joints to a soldering station, and soldering the two solder feet of the SMD LED respectively to the pair of solder joints;
- conveying the soldered SMD LED to a soldering inspection station to inspect a soldering quality of the SMD LED;
- arranging a third wire side by side with the two wires on the production line;
- conveying the inspected SMD LED and the third wire to a first packaging station, and packaging the SMD LED and a portion of the third wire corresponding to a position of the SMD LED inside a packaging adhesive body to form an LED bead;
- conveying the LED bead to a wire cutting station, and determining whether it is to cut the wire off by a wire cutting mechanism; if yes, one of the two wires between two adjacent LED beads is alternately cut off; if not, the wires between two adjacent LED beads are not cut off;
- conveying the LED bead to a second packaging station, and packaging the LED bead and a wire end formed by cutting-off of the wire together inside the packaging adhesive body if the wires between two adjacent LED beads has been cut off;
- conveying the LED bead to an ornament assembling station, placing the first housing on one side of the LED bead, and pre-buckling a second housing to the first housing to form a decorative piece, such that the LED bead is accommodated inside the decorative piece; and
- conveying the decorative piece to a welding station, and welding the first housing and the second housing together using ultrasonic.

12. A method for manufacturing a Light-Emitting Diode (LED) light string ornament, comprising:
- arranging at least three wires side by side on a production line, and connecting the at least three wires together to be an integral;
- conveying the at least three wires to a wire stripping station, and removing insulating layers of at least two of the at least three wires at a set interval to form a pair of opposed solder joints;
- conveying the pair of solder joints to a soldering material station, and coating surfaces of the pair of solder joints with soldering material;
- conveying the pair of solder joints the surfaces of which are coated with soldering material to an LED mounting station, and placing solder feet of a Surface Mounted Device (SMD) LED on the pair of solder joints;
- conveying the SMD LED placed on the pair of solder joints to a soldering station, and soldering the solder feet of the SMD LED respectively to the pair of solder joints;
- conveying the soldered SMD LED to a soldering inspection station to inspect a soldering quality of the SMD LED;
- conveying the inspected SMD LED to a first packaging station, and packaging the SMD LED inside a packaging adhesive body to form an LED bead;
- conveying the LED bead to a wire cutting station, and determining whether it is to cut the wire off by a wire cutting mechanism; if yes, one of the wires between two adjacent LED beads is cut off, if not, the wires between two adjacent LED beads are not cut off;
- conveying the LED bead to a second packaging station, and packaging the LED bead and a wire end formed by cutting-off of the wires together inside the packaging adhesive body if one of the wires between two adjacent LED beads has been cut off;
- conveying the LED bead to an ornament assembling station, placing the first housing on one side of the LED bead, and pre-buckling a second housing to the first housing to form a decorative piece, such that the LED bead is accommodated inside the decorative piece; and
- conveying the decorative piece to a welding station, and welding the first housing and the second housing together using ultrasonic.

\* \* \* \* \*